United States Patent [19]

Rainal

[11] Patent Number: 5,329,170
[45] Date of Patent: Jul. 12, 1994

[54] BALANCED CIRCUITRY FOR REDUCING INDUCTIVE NOISE OF EXTERNAL CHIP INTERCONNECTIONS

[75] Inventor: Attilio J. Rainal, Morristown, N.J.

[73] Assignee: AT&T Bell Laboratories, Murray Hill, N.J.

[21] Appl. No.: 166,342

[22] Filed: Dec. 13, 1993

Related U.S. Application Data

[63] Continuation of Ser. No. 841,139, Feb. 25, 1992, abandoned.

[51] Int. Cl.⁵ .................. H01L 25/00; H03B 1/00
[52] U.S. Cl. ........................ 307/303.1; 307/443; 328/163
[58] Field of Search .................. 307/303.1, 443; 328/162, 163, 165, 167; 333/81 A

[56] References Cited

U.S. PATENT DOCUMENTS 3,383,618  5/1968  Engelbrecht .................. 328/163
3,584,235  6/1971  Fukui et al. .................. 328/163
4,398,106  8/1983  Davidson et al. .................. 307/549

OTHER PUBLICATIONS

Rainal, A. J., *AT&T Bell Laboratories Technical Journal*, 63, No. 1, Jan. 1984.
Blood Jr., W. R., *MECL System Design Handbook*, Motorola Semiconductor Products Inc., May 1980.

Primary Examiner—Timothy P. Callahan
Assistant Examiner—Toan Tran
Attorney, Agent, or Firm—Bruce S. Schneider

[57] ABSTRACT

Ground noise associated with lead inductance in electronic systems containing multiple lead integrated circuits is substantially reduced by including, for each chip driver lead that carries a signal, a complementary lead which carries the the inverse of that signal. These balanced pairs are continued not only in the wire bonds and lead frame of the integrated circuit, but also through any connecting assembly such as a printed wiring board or multichip module to the associated balanced chip receivers.

8 Claims, 2 Drawing Sheets

BALANCED CIRCUITRY FOR REDUCING INDUCTIVE NOISE OF EXTERNAL CHIP INTERCONNECTIONS

This application is a continuation of application Ser. No. 07/841,139, filed on Feb. 25, 1992, now abandoned.

BACKGROUND OF THE INVENTION

1. Field of the Invention

This invention relates to electronic devices and, in particular, to multiple lead electronic devices.

2. Art Background

The enhancement of device density in integrated circuits (ICs) has seen rapid progress. This increase in density has caused a concomitant increase in the number of leads associated with the IC. Indeed, integrated circuits having up to 256 leads are readily available. These leads are dedicated for chip drivers (IC circuit output which drive external interconnections), ground returns, power and other signals. Typically, these leads, 10 emanating from the silicon chip (FIGS. 1 and 2) or multichip modules 60 (FIG. 3) and terminating at a lead frame as shown at 20 in FIG. 1 or on a circuit board, 30 in FIGS. 2 and 3, are spaced a minimum of 0.004 inches and are at smallest 0.001 inches in diameter and 0.10 inches in length. Generally, these connections from the silicon to the lead frame or circuit board are made by wire bonding—a process that entails thermosonic bonding of the leads to pads. Lead lengths attainable with conventional technology such as lead bonding because of mechanical constraints, are unlikely to be reduced much below 0.04 inches. Nevertheless, there is a strong desire to reduce lead length since this results in reduced lead inductance.

An A.C. signal generated by a chip driver and returning on one or more ground leads produces a potential difference across the common ground leads. (An A.C. signal includes digital signal information.) For integrated circuits with a large number of chip drivers which rapidly switch in the same direction (e.g. 16 chip drivers switching in 1 ns and even more significantly 32 chip drivers switching in 1 ns), the combined effect of this induced ground potential difference (sometimes referred to as ground bounce) or inductive noise is significant. That is, an induced transient potential difference occurs between the ground plane 42 (FIG. 4) present in teh driver integrated circuit 45 and the ground plane 41 associated with interconnects (e.g. printed wiring boards, PWBs) that provide electrical communication between these integrated circuits. This significant difference in potential between ground planes produces errors in information processing. Inductive noise of the power leads is of less concern because by-pass capacitors can be applied very close to the chips to help reduce power fluctuations.

The difference in ground potential is proportional to the rate of change of driver current, the number of chip drivers switching, the combined ground return (including via 43, the ground plane, 41, ground via 70, ground lead 10, and via 44) inductance, and inversely proportional to the number of ground returns. (See A. J. Rainal, *AT&T Bell Laboratories Technical Journal*, January 1984.) Thus, the induced ground potential becomes larger and errors become more frequent with increased current rate of change which in turn increases with increases in data rate or decreases in rise time, $T_r$, increases in the current difference, $\Delta I$, incurred during the rise time and increases in the number of chip driver leads $N_d$. Generally, for $\Delta I\, N_d/T_r$ values above 16 ma per ns, error rates become significant and for values above 32 ma per ns become of even greater concern. (For analog signals, a similar figure of merit is appropriate. If IC's having both analog and digital circuitry, errors from the digital component generally predominate.)

A variety of approaches has been employed to reduce inductive noise, (also denominated ground bounce, simultaneous switching noise, or delta I noise). For example, non-linear circuitry has been proposed in U.S. Pat. No. 4,398,106. Additionally, solder bump leads have been proposed, at least in part, to reduce inductance. In this approach, small nodes of solder are present on the integrated circuit at each electrical connection point. Corresponding nodes of solder (or bare contact pads) are present on the printed wiring board. Alignment and reflow of the solder bumps produce a plurality of relatively low inductance connections. However, the use of solder bumps and other relatively recent technology is substantially more expensive than conventional wire bonding and has not achieved the reliability of wire bond technology. Since wire bonding is a mature and reliable technology with a large capital investment, it is quite desirable to reduce the inductive noise and retain the wire bond technology.

SUMMARY OF THE INVENTION

It is possible to reduce or even essentially eliminate substantial errors associated with inductance levels in analog and advantageously in digital circuits by adding, for each chip driver lead (designated a primary lead), a corresponding lead (designated a secondary lead) to the integrated circuit. (A chip driver lead is one carrying an output signal—in contrast to a ground, only an input signal, or a power supply—where the circuitry driving the lead imposes a signal such that within twice the signal rise time an output signal is or has been imposed on at least 8 other leads. The time a signal is imposed on a lead is the time it reaches 10% its maximum amplitude.) Each secondary lead is internally connected in the integrated circuit so that, at any time, current traversing a secondary lead has the same amplitude, but the opposite sign, as A.C. current traversing its corresponding primary lead. Each lead of a pair is maintained at a suitable distance from the other and from ground so that the resulting impedance of the pair is approximately impedance matched to other portions of the circuit. This correspondence of pairs is continued to the chip receivers in the interconnecting equipment e.g. other IC's in the multichip module (MCM) or other IC's on the PWB.

Through this expedient, the current in the primary lead 51 (FIG. 5) of each chip driver returns on its associated secondary lead, 52. Therefore, little or no current returns through the common ground leads (vias and ground plane) with their associated ground inductance. Since only one lead is added for each chip driver lead, the total leads are not substantially increased. Thus, without substantial complications, errors resulting from inductive noise are significantly reduced and conventional wire bond technology is still usable. Indeed, even for total driver signals of 160 ma having rise times of 100 ps, signal errors resulting from inductive noise is essentially eliminated as compared to a corresponding device having no matching leads for each chip driver. Through this expedient, it is possible to simultaneously switch many more chip drivers 54 as required in digital architecture designs based on higher bits per word (i.e. greater than 32). As a byproduct, the invention also substantially reduces crosstalk and significantly increase noise immunity.

DETAILED DESCRIPTION

Figure 1:
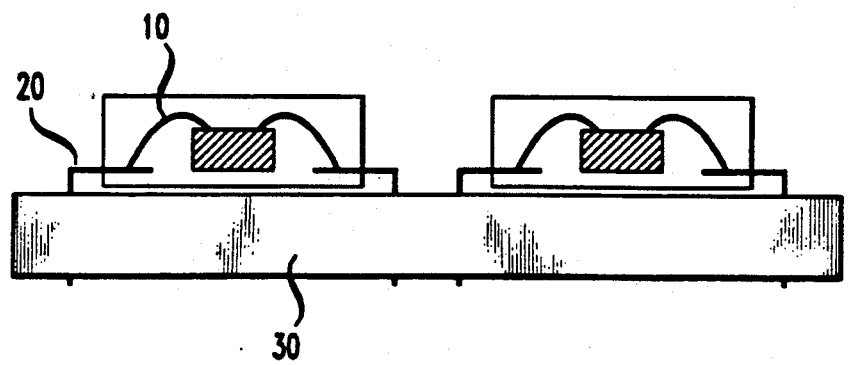
FIGS. 1 to 3 are illustrative of configurations in making contact between devices.
Figure 2:
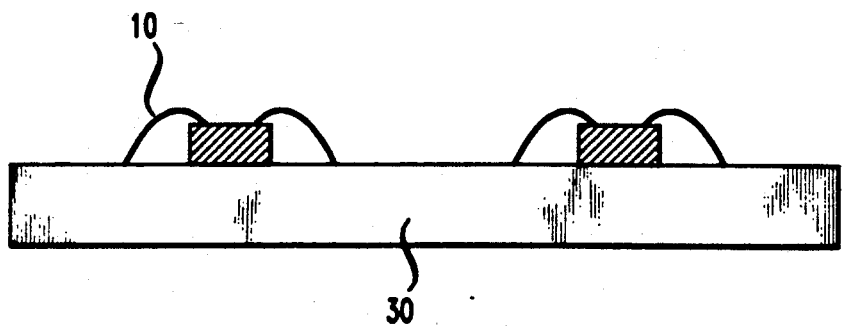
Figure 3:
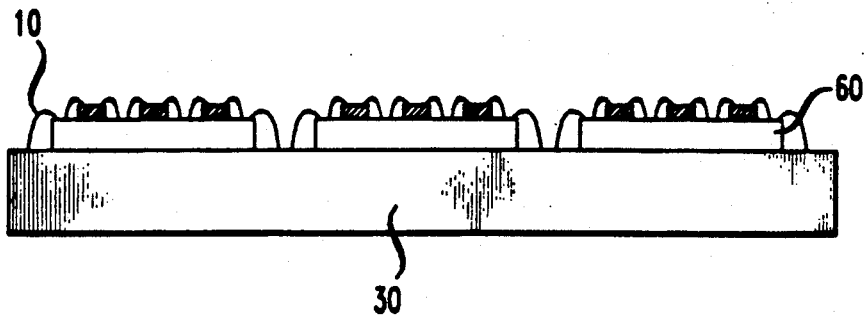
Figure 4:
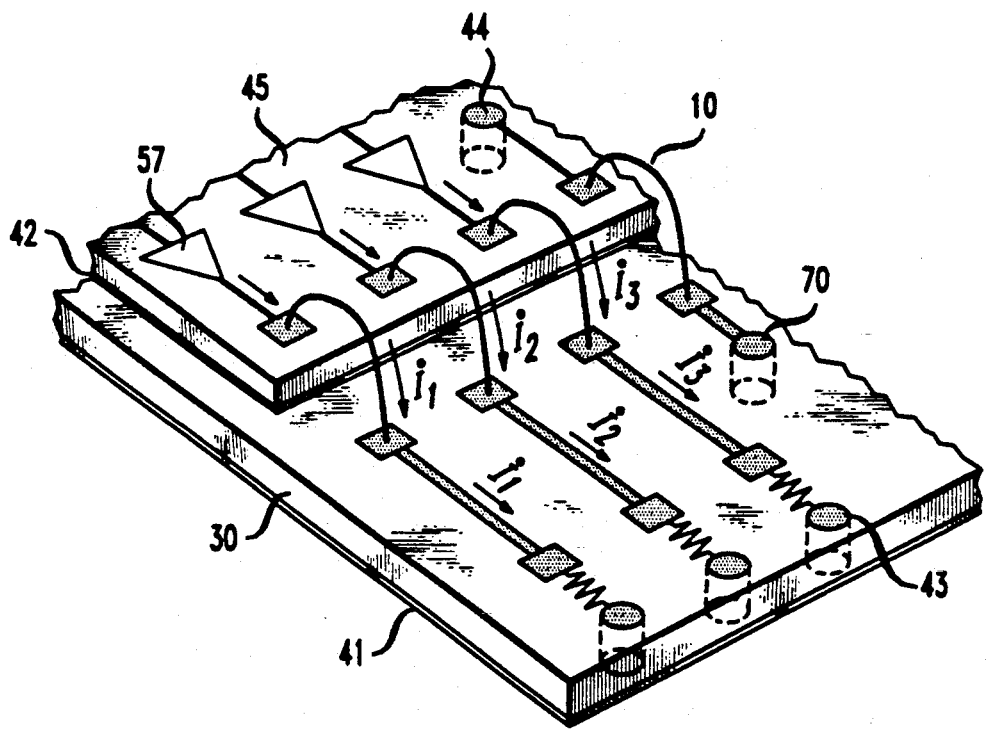
FIG. 4 is illustrative of configurations having no secondary leads.
Figure 5:
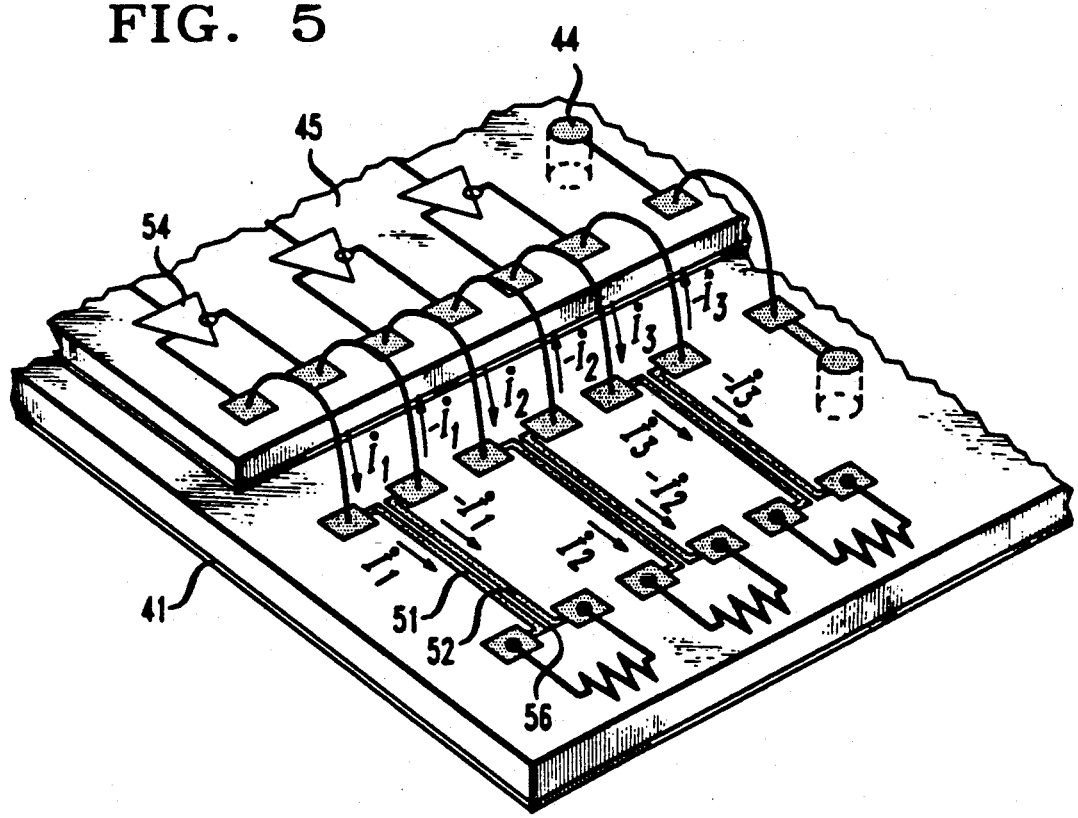
FIG. 5 is illustrative of an embodiment involved in the invention.

As discussed, errors associated with inductance are substantially reduced by employing a pair of leads, 51 and 52, for each chip driver lead of an integrated circuit. For pedagogic purposes, these leads will be denominated the primary lead and the secondary lead. The primary and secondary leads are considered driven signal bearing leads (driving external interconnection as opposed, for example, to a power lead, a ground lead, or input only signal leads) in a conventional integrated circuit. The secondary lead is driven so that it always is carrying a complementary A.C. current—an A.C. current having the same amplitude but the negative sign of that in the primary lead. (A.C. current as used in this context includes digital signals.) This correspondence of primary and secondary leads is advantageously continued from the driver leads of the integrated circuit through the interconnects to the chip receivers located in other integrated circuits of the electronic system.

The drive mechanism for producing a complementary signal in the secondary leads is conventional. As described in the *MECL SYSTEM DESIGN HANDBOOK*, Motorola Semiconductor Products, May 1980, typical integrated circuit drivers required for producing the corresponding inverse signals are already present in many IC's (i.e. balanced drivers 54), but have not been applied to reduce inductive noise. Thus, these drivers already provide both primary and secondary outputs. The drivers generate a pulsed signal on the primary lead and a corresponding pulsed signal that is 180° out of phase with, and with the same amplitude as, the primary signal on the secondary lead.

The geometry of the primary and secondary leads is generally maintained to yield an impedance which matches that of the electronic system. In present day systems, balanced impedances are generally limited to a range of 90 to 110 ohms. Impedance of a primary/secondary pair depends on the separation between these leads and the separation of each lead relative to conductors that are maintained at ground potential. In typical PWBs, one layer, 41, of the PWB is maintained at ground to form, for example, a microstrip transmission line. Therefore, the impedance is primarily determined by the spacing 56 between primary and secondary leads and the height above the ground plane layer of the printed wiring board. Generally, the impedance is determined by the formula:

$$Z_B = \frac{118}{\sqrt{\epsilon_r}} \ln\left[\frac{9d}{p[1 + (d/r_0)^2]^{\frac{1}{2}}}\right] \text{ohms,}$$

where $t_0$ = thickness of conductors
$W$ = width of conductors
$s_0$ = space between primary and secondary conductors
$r_0 = W + s_0$
$h$ = height above ground plane + $t_0/2$
$d = 2h$
$p = 2(W + t_0)$
$\epsilon_r$ = relative dielectric constant.

Typically, for $W = 6$ mils, $t_0 = 0.5$ mils, $s_0 = 4$ mils and $\epsilon_r = 4.2$, the height of these conductors above the ground plane is in the range 5 to 20 mils to yield impedances in the desired range.

It is not necessary that each primary driver signal lead have a corresponding secondary lead or that the signal applied to the secondary lead, if present, precisely correspond to that in the associated primary lead. Substantial meaningful improvement is achieved when at least 20%, preferably 50%, most preferably 90% of errors induced by potential simultaneous switching noise are eliminated by using an associated secondary lead. Therefore, for example, if 32 primary leads and 30 secondary leads are employed (thus yielding 2 unbalanced drivers, 57), then 94% compensation is present with a concomitant reduction in errors. Similarly, if there is present 32 primary leads, each carrying a digital signal of 10 ma, and 32 secondary leads, each carrying a digital signal of 9 ma, then a 90% compensation is attained. Correspondingly, the presence of fewer secondaries than primarys in addition to secondary A.C. currents no precisely tracking those in the corresponding primary leads, yield together a proportional reduction in compensation.

I claim:

1. An apparatus including A) an integrated circuit with a first multiplicity of electrical drivers with an associated multiplicity of signal outputs leads and electrical interconnects from said multiplicity of output leads wherein said interconnects are external to said integrated circuit and provide electrical communication from said multiplicity of output leads to elements external to said integrated circuit, and B) further including an electrical ground conducting path from said external element to said integrated circuit characterized in that at least 20% of potential error due to noise induced in said ground path by changes in an electrical signal present in at least one of said multiplicity of output leads wherein said noise is compensated for by the presence of a sufficient number of associated secondary leads each corresponding to one of said output leads and said first drivers to transmit a compensating signal on said secondary leads such that the noise induced in said ground path from said compensating signal compensates for said noise introduced by said signal in said output leads.

2. The apparatus of claim 1 wherein the number of said secondary leads is equal to the number of said signal output leads.

3. The apparatus of claim 1 wherein said signal is digital.

4. The apparatus of claim 1 wherein said electrical interconnect comprises a printed wiring board or multichip module.

5. A method of transmitting a plurality of signals from leads of an integrated circuit through electrical interconnects to a plurality of elements, said interconnects and said elements being external to said integrated circuit and compensating for at least 20% of potential errors due to noise induced in a ground path connected between said elements and said integrated circuit said method comprising the step of transmitting a compensating signal on a sufficient number of secondary leads from said integrated circuit to achieve said 20% compensation.

6. The method of claim 5 wherein said signal is digital.

7. The method of claim 5 wherein the number of said secondary leads is equal to the number of said signal leads.

8. The method of claim 5 wherein said electrical interconnect comprises a printed wiring board or multichip module.

* * * * *